United States Patent [19]

Williams et al.

[11] Patent Number: 5,457,702

[45] Date of Patent: Oct. 10, 1995

[54] CHECK BIT CODE CIRCUIT FOR SIMULTANEOUS SINGLE BIT ERROR CORRECTION AND BURST ERROR DETECTION

[75] Inventors: Everett L. Williams, III, Mays Landing, N.J.; Harold L. Martin, Kernesville, N.C.; Jien-Chung Lo, West Kingston, R.I.

[73] Assignee: The United States of America as represented by the Secretary of the Navy, Washington, D.C.

[21] Appl. No.: 153,453

[22] Filed: Nov. 5, 1993

[51] Int. Cl.⁶ .......................... H03M 13/00; G06F 11/10
[52] U.S. Cl. .................. 371/379; 371/37.4; 371/37.6; 371/38.1; 371/40.4
[58] Field of Search ................... 371/37.1, 37.4, 371/37.6, 37.9, 38.1, 39.1, 40.1, 40.4

[56] References Cited

U.S. PATENT DOCUMENTS

| | | | |
|---|---|---|---|
| 3,582,878 | 6/1971 | Bossen | 371/37.9 |
| 3,601,798 | 8/1971 | Hsiao | 371/37.9 |
| 3,634,821 | 1/1972 | Bossen | 371/37.9 |
| 4,961,193 | 10/1990 | Debord et al. | 371/37.2 |
| 4,993,028 | 2/1991 | Hillis | 371/39.1 |
| 5,251,219 | 10/1993 | Babb | 371/37.4 |

OTHER PUBLICATIONS

Hsiao, M. Y., Bossen, D. C. and Chien, R. T., "Orthogonal Latin Square Codes", IBM Journal of Research Development, Jul. 1970, pp. 390–394.

Primary Examiner—Stephen M. Baker
Attorney, Agent, or Firm—Michael J. McGowan; Michael F. Oglo; Prithvi C. Lall

[57] ABSTRACT

A system for correcting a single bit error and detecting burst errors is provided. A check bit generator generates partition check bits and burst check bits based on a H-parity matrix data regeneration scheme which provides an a single error correction and multiple bit error detection code which is linear and has the property of self orthogonality within a subclass of self orthogonal codes exclusive of Latin square codes. These check bits provide two independent sources for ascertaining the correct value for any given data bit. An error corrector and detector takes as input the data bits and check bits and provides a corrected data bit output as well as a set of error status lines. The error corrector and detector consists of Error Corrector, error corrector/detector and Error Status modules. The Error Corrector and error corrector/detector modules run in parallel providing a high speed Error Correction and Detection implementation, and providing a simplicity of logic structure compatible with application specific integrated circuit (ASIC) design and production processes.

7 Claims, 9 Drawing Sheets

FIG. 1A

H-MATRIX IN ACCORDANCE WITH PRESENT INVENTION
(FOR EXEMPLARY CASE OF p=32)

FIG. 1B
(PRIOR ART)

H-MATRIX FOR LATIN SQUARE CODE
(FOR EXEMPLARY CASE ON p=32)

DATA PARTITIONING FOR CHECK BITS

| | $d_0$ | $d_1$ | ••••• | $d_{m-2}$ | $d_{m-1}$ |
|---|---|---|---|---|---|
| $c_0$ | | | | | |
| $c_1$ | $d_m$ | $d_{m+1}$ | ••••• | $d_{2m-2}$ | $d_{2m-1}$ |
| | | | | | |
| $c_{n-2}$ | $d_{(n-2)m}$ | $d_{(n-2)m+1}$ | ••••• | $d_{(n-1)m-2}$ | $d_{(n-1)m-1}$ |
| $c_{n-1}$ | $d_{(n-1)m}$ | $d_{(n-1)m+1}$ | ••••• | $d_{nm-2}$ | $d_{nm-1}$ |
| | $c_n$ | $c_{n+1}$ | | $c_{n+m-2}$ | $c_{n+m-1}$ |

PARTITION CHECK BITS

BURST CHECK BITS

FIG. 3

CHECK BIT CODE CIRCUIT FOR SIMULTANEOUS SINGLE BIT ERROR CORRECTION AND BURST ERROR DETECTION

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

(1) Field of the Invention

The present invention relates generally to digital error correction and detection schemes. In particular, it is a design for single bit error correction and burst (multiple bit) error detection in high speed digital memories.

(2) Description of the Prior Art

Techniques and methodologies for error correction and detection have existed for over thirty years. Early attempts at error correction and detection were only capable of detecting and correcting single bit errors. More complex error correction and detection schemes capable of correcting and detecting multiple bit errors were later developed. In many of the prior art approaches to error correction and detection these two functions are performed serially. Earlier in the prior art the error correction and detection process comprises: (1) check bits are regenerated from the received information bit; (2) syndrome bits are generated by comparing the regenerated check bits and the received check bits; (3) the syndrome bits are decoded to determine the erroneous location; and (4) the error correction is accomplished by complementing the erroneous bit located by decoding the syndrome.

With the advent of modern high speed memories, these complex schemes proved to be too time intensive and a less complex parity scheme capable of correcting single bit errors and detecting double bit errors was adopted.

The prior art includes one-step majority decoding in conjunction with single and multiple error correction, and related coding and design. A discussion of this may be found in M. Y. Hsiao, D. C. Bossen and R. T. Chien, "Orthogonal Latin Square Codes", IBM J. RES. DEVELOP., pp. 390–394, July 1970, which is hereby incorporated herein by cross-reference. Moreover for purposes of single error processing, the prior art approach only accommodates a specific format arrangement of information unit (commonly referred to as "data word"). This specific format is characterized as having a data word size of "p" bits, and involving partitioning with a size of partition of m bits, where "m" is exactly the square root of p exactly the square root of p for purposes of single error processing.

Some of the salient considerations of the present invention over the previous art include more robust error detection, separation of error detection from error correction and more flexibility in the data word length.

SUMMARY OF THE INVENTION

Accordingly, it is an object of the present invention to provide a technique for correcting single bit errors and detecting burst errors.

It is a further object of the present invention to implement this technique in parallel in a single module.

A still further object of the present invention is to provide a technique for optimal performance of error correction and detection which can provide optimal fault tolerance and yet be capable of providing such correction and detection quickly enough for use with modern high speed memories.

A still further object is to provide the implementation of both error correction and detection employing one-step majority circuitry.

A yet further object is to provide the implementation of a range of single error processing scenarios using a combination of self orthogonal and linear coding.

A yet another objective is to provide a technique for optimal performance of correcting single bit error and detecting burst errors which may be implemented with the convenience of employing Application Specific Integrated Circuit (ASIC) computer aided design and production methods.

In accordance with the present invention, a design is provided for an error corrector and detector (ECD) capable of correcting single bit errors and detecting burst errors. The design consists of two main features: one for error detection and one for error correction. These features operate in parallel such that the correction and detection phases may occur simultaneously. The error detection feature utilizes a single phase "exclusive-OR" (EOR) circuit to check each partition of the data for errors. The error correction feature uses a single phase "exclusive-OR" (EOR) circuit in combination with a single phase "voting" (majority) circuit to determine the correct value for each data bit. The outputs of the error detection circuit for each partition are combined to generate the error status signal output.

In further accordance with the present invention, a design is provided which utilizes the aforementioned error corrector and detector (ECD) in conjunction with existing high speed memories and a central processing unit (CPU) to provide a complete four cycle memory system.

BRIEF DESCRIPTION OF THE DRAWINGS

Other objects and advantages of the present invention will become more obvious hereinafter in the specification and drawings, wherein:

FIG. 1A is an H-parity matrix diagram (convention for representing data regeneration schemes) useful in describing the operation of the check bit generator of FIG. 1 in conjunction with a memory system employing a size of unit of data of 32 bits;

FIG. 1B is an H parity matrix diagram employed in a prior art device;

FIG. 3 is another type of matrix diagram (unique for purposes of describing the present invention) useful in describing the relationships between (i) partitioning of a data word in accordance with the present invention, (ii) the arrangement of binary digit values in the H-parity matrix of FIG. 1A, and (iii) certain exclusive-ORING circuitry;

DESCRIPTION OF THE PREFERRED EMBODIMENT

Figure 1:
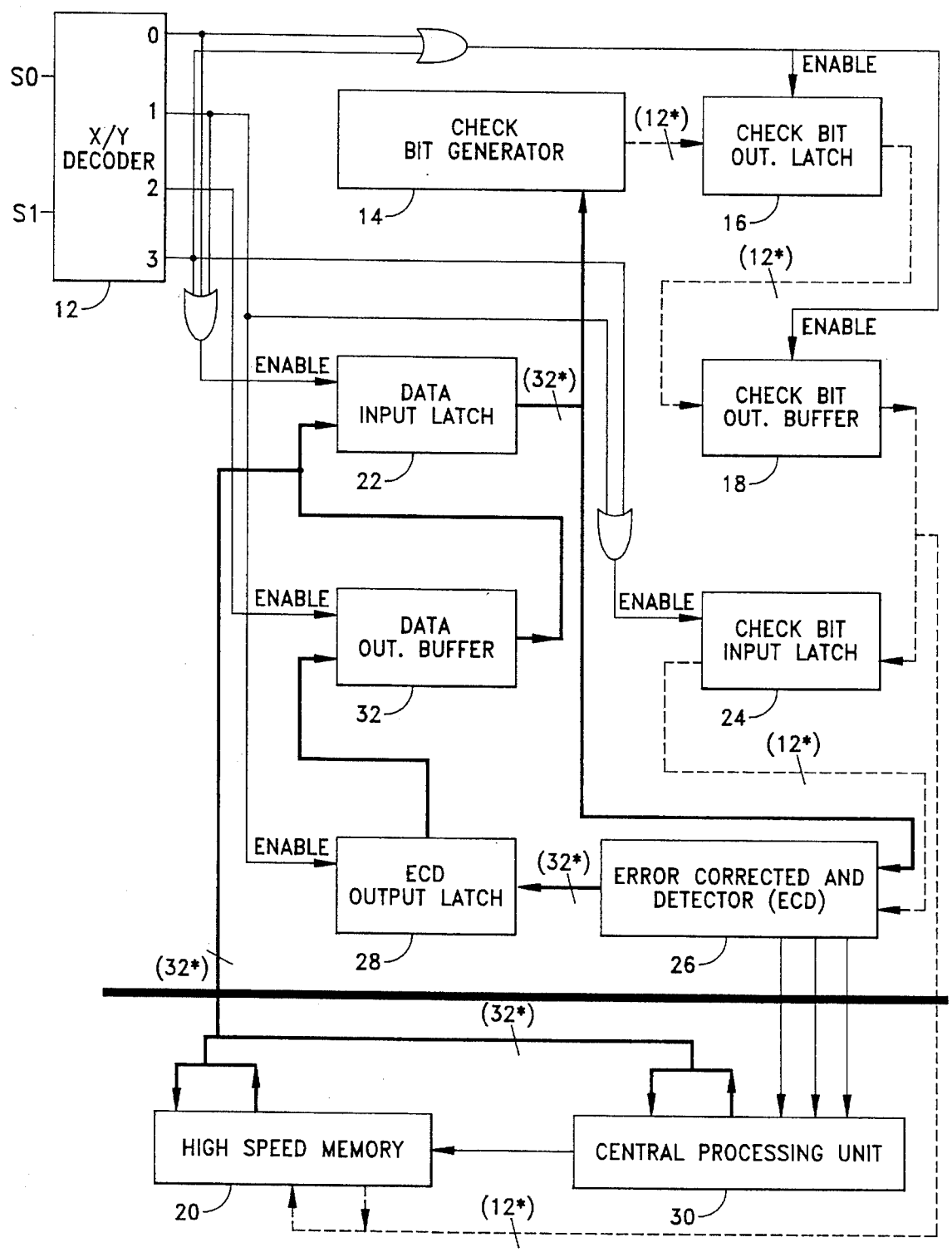
FIG. 1 is a block diagram of a CPU and memory system including the novel error corrector and detector of the present invention.

Referring now to the drawings, and in particular to FIG. 1, one embodiment is shown of the error correction and detection system 10 in an operative environment of a high speed memory 20 and a central processing unit (CPU) 30 at a block diagram level. The decoder 12, which is coupled to the enable inputs of various other circuits, is a simple two input X/Y decoder implemented by a conventional logic network within the design capability of persons of skill in the art to generate four distinct cycles in the memory system: write, read(1), read(2), and diagnostic. In the vernacular of those skilled in the art the foregoing conventional logic network is sometimes referred to as "glue logic".

The error correction and detection system 10 is not limited to memories having one particular size of information unit (commonly called "data word"). Given a size of data word of "p" bits, this data word is then subdivided into "n" partitions which contain "m" bits each. For example, in connection with the embodiment corresponding to the H-parity matrix (or simply "H-matrix") of FIG. 1A, the size of data word p is thirty-two (32) bits (data bits $d_0$ through $d_{31}$), which is broken down into eight (8) partitions, n, each partition containing four (4) bits, m.

An H-matrix is a conventional form of representation of a data regeneration scheme for data words. It will be appreciated that the H-matrix scheme in accordance with the present invention produces both error correction check bits and burst error check bits. As is conventional, the data for creating the check bits is permanently stored in the high speed memory 20 as "fixed, hard data", which shall hereinafter be called "check bit creating data". Under control of a decoder 12 the check bit data is latched into a check bit generator 14. The check bits which are thusly generated are conventionally stored in memory 20 in operative association with corresponding inputted data words, so that error correction (i.e., data regeneration) and error detection functions can be performed when the data word is retrieved from memory 20. The positions of the matrix in the horizontal direction represent a series of data bit positions ($d_0, d_1 \ldots d_{31}$) and a series of check bit positions ($C_0, C_1 \ldots C_{11}$). The top row of the matrix is not part of the matrix. Instead it is a header row containing the identity of the bit position or check position of the column beneath. Beneath the header row are twelve (12) rows, which together with the bit position columns constitute the matrix's format. Each vertical position in a column is alternatively predeterminedly coded as a logical one ("1") position-depicted as a "1" in FIG. 1A—, or as a logical zero ("0") position-depicted as a blank space in the FIG. 1A—. The series of ones ("1s") and zero ("0s") for data or check bit positions will sometimes hereinafter in this description and in the appended claims be termed an "H-matrix vertical column sequence of binary values". The vertical column sequences beneath the full series of data bit positions constitute the aforesaid check bit creating data. How these sequences are involved in the generation of the check bits, and how the check bits perform single bit error correction and multiple bit error detection will become apparent as the description proceeds. The function which these sequences perform in the generation of a parity code will also be described later herein.

In accordance with the present invention the size of each partition, m, is chosen such that m is the largest integer less than the square root of p which evenly divides p. In the case illustrated in FIG. 1A, p=32, n=8 and m=4. The number of partitions, n, then is p/m. The H-matrix of FIG. 1A includes vertically extending lines defining these partitions, namely the lines between subsets of bit positions $d_0 \ldots d_3$, $d_4 \ldots d_5, \ldots$ etc.

As will be described in greater detail later herein, check bit generator 14 for producing check bits based upon the aforesaid H-matrix generates an error correction code which is characterized both as linear and having the property of self orthogonality, and in the instant invention is further characterized as belonging to a subclass of self orthogonal codes which consists of all self orthogonal codes exclusive of Latin square codes (i.e., exclusive of the Latin square codes proposed in the hereinabove referenced article "Orthogonal Latin Square Codes" by M. Y. Hsiao et al in which the partition size m is exactly the square root of the data word bit length, p). This error correction code operatively interacts with the aforesaid format of the memory's information unit (or data word) as will be described.

Referring again to FIG. 1, when both inputs, S0 and S1, to the X/Y decoder 12 are low, the system is in the write cycle. In this cycle, check bit creating data is read from a data input latch 22 into the check bit generator 14. The check bit generator 14 operatively coacts with the data in an operatively relationship in synchronism with the aforesaid partitioning of p bits of the information unit into n partitions each containing m bits. The first n check bits are set to logical states based on the value of an exclusive-OR of the bits in each partition. The next m check bits are set to logical states based on the values of an exclusive-OR of the ith bit (where i ranges from 1 to m) in each partition. Once the check bits are computed, the check bits pass through a check bit output latch 16, pass through a check bit output buffer 18, and thence enter high speed memory 20.

When the first input S0 to the X/Y decoder 12 is high, and the second S1 is low, the system is in the read (1) cycle. During this cycle, the stored information data bits are read from high speed memory 20 and through a data input latch 22, and the corresponding check bits are read from a check bit input latch 24; whereby they are caused to enter into an error corrector and detector (ECD) 26. The error corrector and detector 26 analyzes the data and, as the final step in the read(1) cycle, writes the corrected data to an ECD output latch 28. Three error status lines (which will be described more specifically in conjunction with FIGS. 2 and 6) are also made available to central processing unit (CPU) 30 at the completion of this cycle.

When the first input, S0, to the X/Y decoder 12 is low, and the second, S1, is high, the system is in the read (2) cycle. During this cycle, corrected data from a ECD output latch 28 is passed through a data output buffer 32 to central processing unit (CPU) 30.

Figure 2:
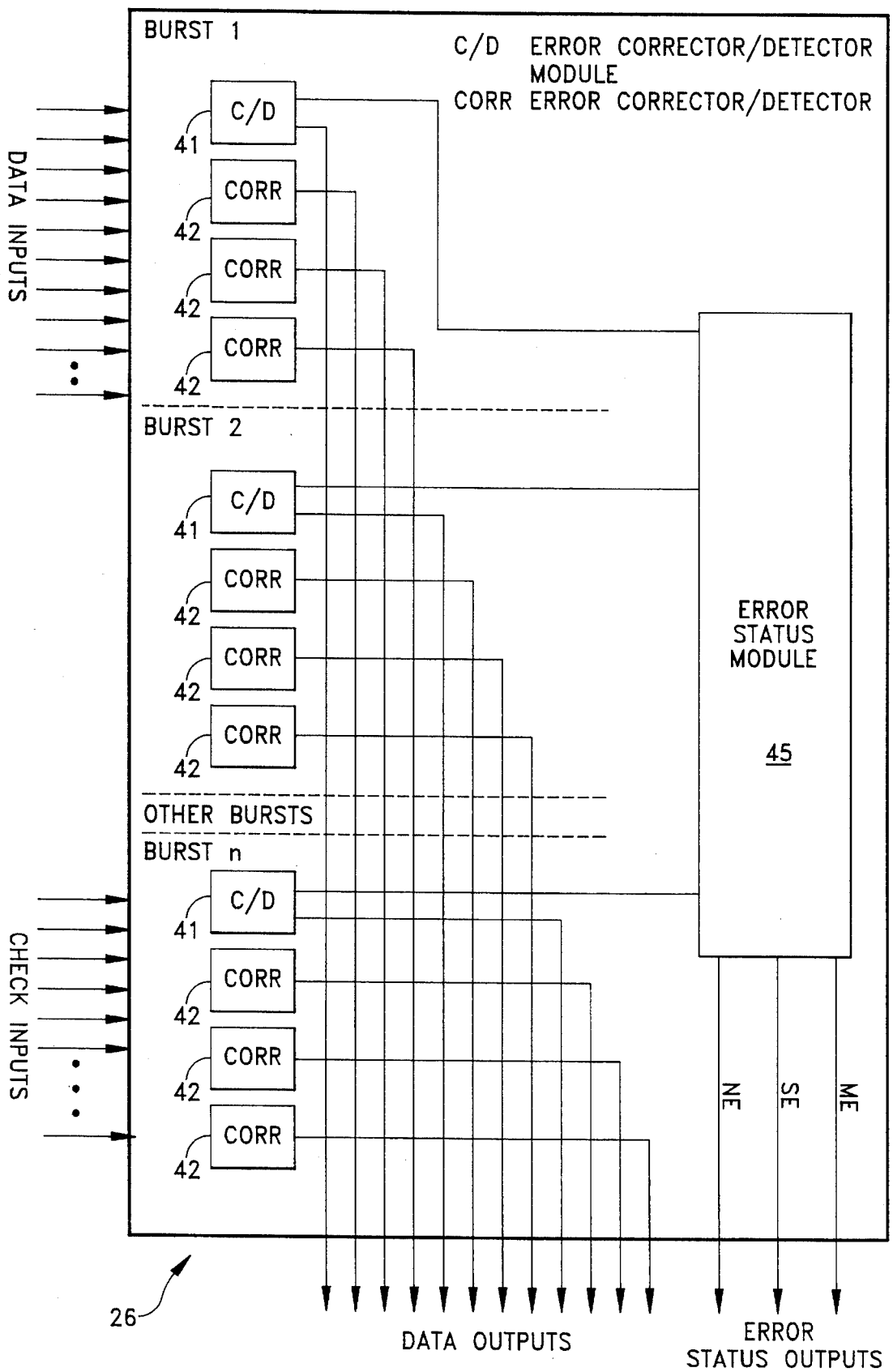
FIG. 2 is a block diagram of the error corrector and detector (ECD) of FIG. 1, which block diagram is at a lower level (i.e., shows more detail) than that of FIG. 1.

When both inputs, S0 and S1, to the X/Y decoder 12 are high, the system enters the diagnostic cycle. This is done by simultaneously enabling data input latch 22, check bit output latch 16, check bit output buffer 18 and check bit input latch 24. During this cycle, the error code is passed directly from check bit generator 14 along with information data bits to ECD 26 bypassing a high speed memory 20. This cycle provides a check of error corrector and detector system 10 integrity which does not rely on the integrity of high speed memory 20. Reference is now made to FIG. 2 in which the three error status lines emanating from error corrector and detector 26 are more specifically designated ME (multi-bit error status line), SE (single bit error status line) and NE (no error status line). If either the single bit error (SE) status output line or multi-bit error (ME) status output line from ECD 26 are high at the completion of this cycle, a failure of the error corrector and detector system 10 is indicated.

It is to be appreciated that many of the units and components which have thus far been described are in and of themselves conventional well known components of digital processor systems and logic networks, and the function which each performs is in and of itself conventional.

Central processing unit (CPU) 30 and high speed memory 20 operatively interact with system 10 in a manner unique to the instant invention; however, apart from this interaction CPU 30 and memory 20 are conventional. X/Y decoder 12 is a standard two input decoder which enables one of four outputs based on the states of the two inputs. Check bit output latch 16, check bit input latch 24, data input latch 22, and ECD output latch 28 are all standard latches which prevent data movement except when enabled. They are used to synchronize data movement within the system during each of the four cycles. Data output buffer 32 and check bit output buffer 18 are standard buffers which cooperate in the provision of the synchronization functions of their associated latches, as well as restoring the signals to their proper voltage levels.

Referring again to the H-matrix of FIG. 1A which is adapted for data word size of thirty-two (32) bits, the H-Matrix comprises p=32 horizontally extending data bit positions and additionally includes twelve (12) horizontally extending check bit positions. This number of check bit positions is determined by the following calculation process. The number of check bit positions, r, is r=[p/m]+m. (For the example of the H-matrix of FIG. 1A this is [32÷4]+4=12). The overall size of the H-matrix unit is k=p+r bit positions in the horizontal direction. (For the FIG. 1A H-matrix example this is 32+12=44.) This may be seen in FIG. 1A wherein the p horizontally extending matrix bit positions are designated $d_0 \ldots d_{31}$; the r horizontally extending bit positions are designated $C_0 \ldots c_{11}$; and vertical matrix partition lines form eight (8) subsets of the p data bit positions (each subset containing m=4 positions).

The number of rows in the H-Matrix of FIG. 1A is also equal to r (i.e., twelve (12) in the embodiment of FIG. 1A). It is to be appreciated that there is a predetermined relationship between the H-Matrix vertical column sequence of binary values of the r check bit positions and the vertical column sequence of binary values for the data bit positions in the respective ones of the n partitions of full data word length p. Specifically, in considering the sequence of twelve H-Matrix horizontally extending check positions $C_0, C_1, \ldots C_{11}$, it will be appreciated that each of their columnar series of binary values has exactly one "binary one (1) value" from the corresponding row of the columnar series of binary values of any of the n partitions of the full data word of p bits. This enables logical one ("1") states to be generated in the corresponding bit position by exclusively-ORING the data bits which have a "1" in the same row as the check bit. In accordance with conventional and well known parity check bit theory, the H-matrix data regeneration scheme of FIG. 1A results in generation of a single-error correction parity code which is characterized as both linear and self orthogonal. This can be appreciated from the fact that $d_0$ can come from three independent sources, namely (1) the received $d_0$ (i.e., information data); (2) $d_0$ (i.e., one independent source)=$d_1 \oplus d_2 \oplus d_3 \oplus C_0$; and (3)(i.e., another independent source)=$d_4 \oplus d_8 \oplus d_{12} \oplus d_{16} \oplus d_{20} \oplus d_{24} \oplus d_{28} \oplus C_8$.

In the vernacular of those skilled in the art, a parity matrix code produced using the H-Matrix of FIG. 1A would be called a "(44, 32, 4) single error correcting/burst error detecting (SEC/BED)" code. The numerals within the parenthesis in the foregoing term respectively refer to (i) the total number, k, of horizontally extending bit positions of the H-Matrix unit, (ii) the number of such bit positions, p, which are data bit positions, and (iii) the number of bit positions, m, in each partition.

Reference is now made to the diagram of FIG. 3 for an understanding of how the partitioning scheme illustrated by the H-matrix diagram of FIG. 1A enables the generation of both partition check bits and burst check bits. The partition check bits and the burst check bits together serve as the error correction and as the multiple bit error code.

With respect to generation of partition check bits, the left edge of the matrix diagram of FIG. 3 is provided with the caption "Partition Check Bits", and the notations $C_0, C_1 \ldots C_{n-1}$ inscribed therealong from the top to the bottom indicating that the partition check bits are a function of binary data items $d_0, d_1, \ldots d_{m-2}, d_{m-1}, d_m \ldots d_{mm-1}$, (i.e., the "check bit creating data" present in the H-matrix vertical column sequences of binary values respectively in the m bit positions in a respective different one of the n sequential partitions of each respective one of the r horizontally extending rows of bit positions beneath data bit positions $d_0 \ldots d_{31}$ in the header of FIG. 1A) coded into the n sequential partitions of the p horizontally extending data bit positions of the H-matrix of FIG. 1A More specifically, each partition check bit is generated by a suitable logic network for exclusively-ORING the individual binary values constituting the "check bit creating data" within the data bit positions for a different individual partition of n partitions in r row of bit positions below the header of the H-matrix of FIG. 1A.

With respect to generation of burst check bits, the bottom edge of the matrix diagram of FIG. 3 is provided with the caption "Burst Check Bits", and the notations $C_n, C_{n+1} \ldots C_{cn+m-1}$ inscribed therealong indicate that the m burst check bits are a function of the binary values constituting the "check bit creating data" coded into the corresponding ones of the m sequential data bit positions present in each of the n horizontally extending partitions of the sequence of p data bit position in the H-matrix of FIG. 1A. More specifically, each burst check bit is generated by a suitable logic network for exclusively-ORING the individual binary values constituting the check bit creating data in the corresponding individual sequential data bit position of each of the m sequential data positions in each of the n sequential partitions.

From the foregoing discussion of FIGS. 1A and 3 it will be appreciated by those of skill in the art that the partitioning and coding scheme of the H-matrix of FIG. 1A enables implementation of error correctors by majority gates according to the logical sequence:

$$M=AB+BC+AC \tag{1}$$

A majority gate is also known as a "voter" because the output assumes the logic value of the majority of its three inputs. The H-matrix vertical column sequence of binary values in each data bit position, (i.e., in each $d_0, d_1, \ldots d_{31}$) has two binary ones ("1s"). This provides two independent sources to regenerate a data word bit when performing error correction. For example, the following two logical equations are used to generate $d_0$ (i.e., final, or corrected value):

$$d_0(\text{i.e., one independent voting source}) = C_0 \oplus d_1 \oplus d_2 \oplus d_3, \quad (2)$$

and $$d_0(\text{i.e., another independent voting source}) = \\ C_8 \oplus d_4 \oplus d_8 \oplus d_{12} \oplus D_{16} \oplus d_{20} \oplus d_{24} \oplus d_{28} \quad (3)$$

The $d_0$ constituting the third independent voting source for the majority gate input is the $d_0$ as received from the memory. In accordance with well known parity code theory, for single error correcting, the three different versions of $d_0$ are fed to a majority logic function. If a single error occurs, only one of the three versions of $d_0$ may be erroneous, and the majority function logic will indicate the majority, namely the correct value by the uncorrupted two.

A burst error consists of multiple errors in adjacent bits, for exampled errors in $d_3$, $d_4$, $d_5$, $d_6$ and $d_7$ are a burst error of length 5, this type of error usually occurs in 5 bit byte organized memory systems in which one memory chip stores more than one bit at one addressable location. It is to be appreciated that the present invention can detect burst errors up to burst length 2 m-2. Any burst error with the burst length less than 2 m-2 will have at least 2 burst check bits affected by only one erroneous data bit (as will be subsequently amplified upon in a discussion of exclusively-ORING burst check bits). In accordance with well known parity code theory, a burst of burst length between 2 and 2 m-2 can be detected.

(As will be described in further detail hereinafter in connection with the subsequent FIG. 5), once the above described parity checks have occurred, the error inputs are utilized in an error status module to a present error status information signal to the CPU 30 for conventional processing.

It is to be appreciated that the thusly generated code differs from the codes disclosed in the above referenced article "Orthogonal Latin Square Codes" by M. Y. Hsiao et al, by in that in certain important respects the code of the present invention is more universal. The so-called Latin square codes which are the subject of that article require p to be chosen from among a sequence of squared values of integers, i.e., 4, 16, 25, 36, 49 ... etc. In contrast, the present invention allows p to be other whole numbers.

This distinction between Latin square orthogonal code, and the subclass code employed in the present invention can be graphically seen by comparing the H-Matrix of FIG. 1B (which is a copy of that shown on was taken from page 392 of the Hsiao article) with that of the present invention of FIG. 1A.

The above discussed feature of the present invention of employing a subclass of orthogonal code exclusive of Latin square codes enables both implementation of (i) correction of single-error, and (ii) burst error detection over significant ranges of length (in bits) of the information unit, p.

Referring again to FIG. 1A, burst check bit $C_8$ is the parity check of data bits, $d_0$, $d_4$, $d_8$, $d_{12}$, $d_{16}$, $d_{20}$, $d_{24}$, and $d_{28}$; and $C_9$ is the parity check of data bits $d_1$, $d_5$, $d_9$, $d_{13}$, $d_{17}$, $d_{21}$, $d_{25}$, and $d_{29}$; and so on. The burst error detection is accomplished by exclusive-ORING the burst check bit character with the corresponding data bits from memory. The number of burst error parity checks (detectors) is p/n. If the parity check results in an output of "1" this indicates an error has occurred. If the parity check results in an output of "0", this indicates an error has not occurred. Per conventional and well known theory the thusly generated check bits are effective to detect burst errors of burst lengths in the range 2 to 2 m-2.

In case of single error, there is only one parity check result of "1". In accordance to the well known parity code theory, if there are two erroneous bits in a parity check, the result of the parity check will be "0". Referring again to FIG. 1A, assume a burst error of length five (5)—as for example, $d_0$, $d_1$, $d_2$, $d_3$, and $d_4$—occurs. The parity checks with $C_8$ will indicate a "0" while the parity checks with $C_9$, $C_{10}$ and $C_{11}$ will indicate "1s". The burst error is detected because more than one parity check result is "1". When a burst error of length 7 occurs, only one parity check will indicate a "1". In this case there is no way to make distinction between a burst error and a correctable single error. It will therefore be appreciated that for p=32, m=4, the detectable burst length is less than 6.

It is true that error codes involved in the operation of the present invention generally need more check bits than those disclosed in Hsiao et al's article. However, for p=8, 16 and 32, the proposed codes use only 2, 2 and 5 more check bits. It will be appreciated that for this extra "cost" there is a significant gain of speed because error correction and error detection can be performed in parallel.

One form of embodiment in which bit generator 14 may be provided is an application specific integrated circuit (ASIC) design engineered using a commercially available computed aided design computer program language. The computer program written in such a language is then used to implement production of the ASIC at a commercial facility having mask producing equipment that is responsive to the same language. These commercially available languages include the Very High Scale Integrated Circuit (VHSIC) computer aided design (CAD) language and the VHSIC Hardware Description Language. Following the rules for entering design parameters for these types of languages, let p be the bit length of information format, m be the partition size which equals the largest integer less than the square root of p which evenly divides p, r be the number of check bits, and k be the overall number of horizontally extending positions of the H-matrix. Then r=[p/m]+m, and k=p+r. Thus the applicable ASIC parameters for the H-matrix of FIG. 1A are: p=32, m=24, r=12, and k=44.

Stated by way of summarization with reference to FIGS. 3 and 1A, each of the n partitions of the p data bit positions of the H-Matrix is coded to have binary one ("1") values in each of n different H-matrix horizontal rows. The single error correction parity check bit for each partition, n, is generated by exclusively-ORING (EORING) the bits of the corresponding partition. The burst error detection parity check bit is generated by exclusively-ORING (EORING) the binary value in the same position in each partition, n. Among the novel features of the invention is a check bit generator operating with the described arrangement of exclusive-OR logic and with the described arrangement of binary digit values coded into in the H-Matrix to produce these error correcting and detecting codes. Also among the novel features of the invention is the overall arrangement of components of system 10.

FIG. 2 shows one embodiment of error corrector and detector (ECD) 26 and the distinct modules of which it is comprised. For each partition in a data word, there is an error corrector/detector (C/D) module 41 which detects a possible error occurring within that partition. The error corrector/detector module also corrects the value of the first bit within that partition. Since there is one error corrector/detector for each partition, there are a total of n error corrector/detectors. There is one error corrector module 42 for each bit, except for the first bit in each partition. These modules simply correct the data without detecting an error condition. There are a total of n(m−1) Correctors. The outputs of the Corrector/Detectors 41 and Correctors 42 are used to generate the corrected data output stream which is written to the ECD output latch 28 (FIG. 1). The error lines from the error corrector/detector modules 41 are used as inputs to an error status module 45, also within error corrector and detector 26. Error status module 45 provides no-error (NE), single bit error (SE), and multiple bit error (ME) status lines for connection to the central processing unit (CPU) 30 (FIG. 1). Among the notable advantages of the invention is the simplicity of the logic of the error corrector and detector 26. Further (as will be especially appreciated by those of skill in the design of logic circuits for error correction), among such advantages is the fact that the code produced by check bit generator 14 provides single-error correction capability by way of one-step majority decoding having m data bits, with m as any whole number. Further among the advantages (as hereinabove stated) the code generated by check bit generator 14 lends itself to burst-error detection over predeterminable ranges of burst error lengths.

Figure 4:
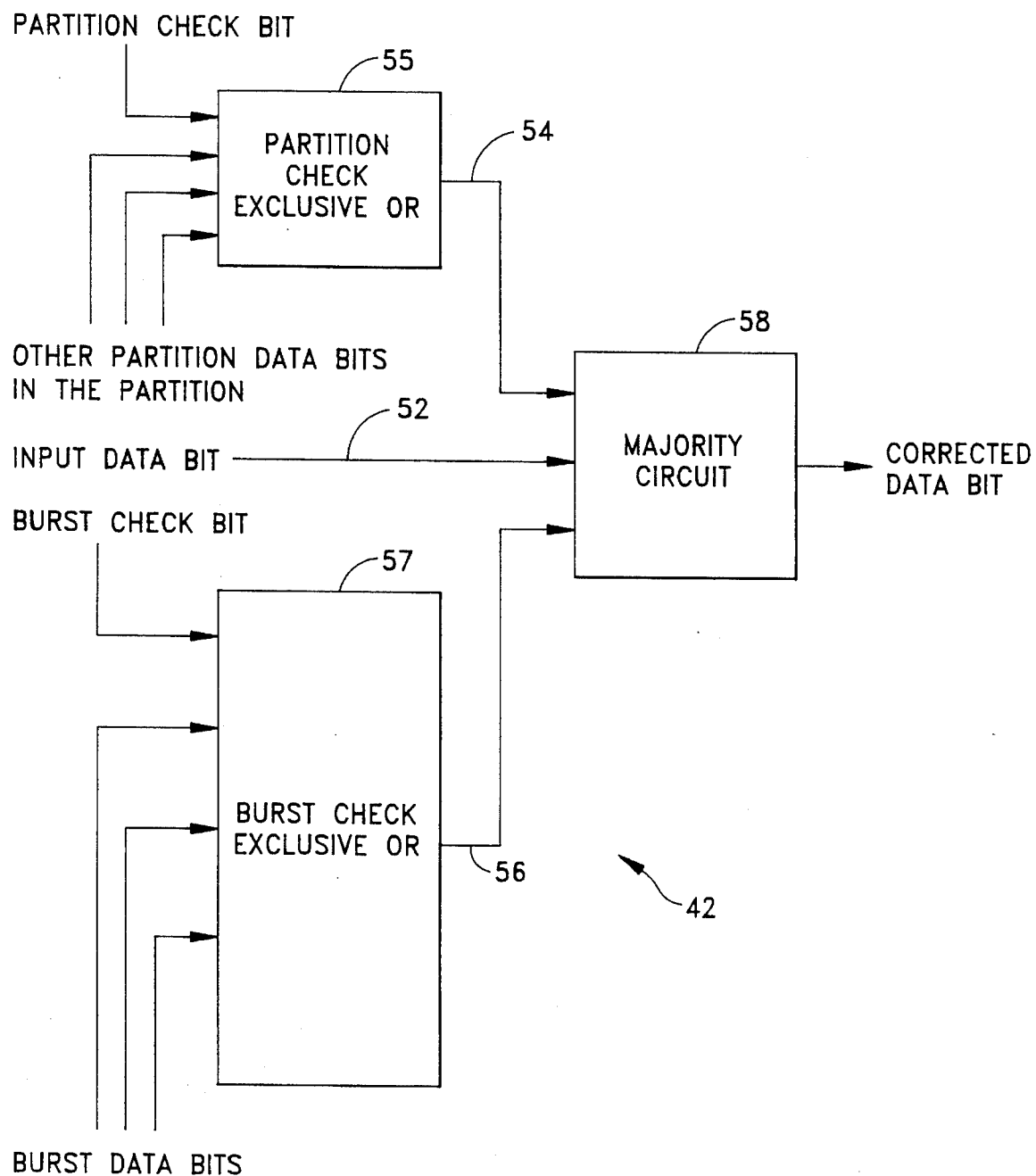
FIG. 4 is a block diagram of one of the error corrector modules of FIG. 2, which block diagram is at a still lower level.

FIG. 4 shows one embodiment of an error correction circuit 42 of error corrector module 26. The logic of the error correction circuit uses a one step majority (voting) decoding circuit 58 to determine the correct value for the bit in question. Each source may "vote" upon whether the correct value for the informational data bit is a logical "0" or "1". The final (corrected) value of the data bit is the value which receives either two or three "votes". The three "votes" come from three sources of binary logic state signals. One of these sources is the informational data itself, arrow 52. Another of the three sources is the output, arrow 54, of an exclusive-OR (EOR) circuit 53 which as its inputs receives the partition check bit and the other "partition check bit creating data bits" of the corresponding partition of the H-matrix. The third of the three sources is the output, arrow 56, of an EOR circuit 57 which as its inputs receives the corresponding burst check bit and the other "burst check bit creating data bits" used to generate the burst check bit. This provides two independent methods of finding the value of the data bit. It is to be appreciated that the foregoing structure of error correction module 42 has a notable advantage of simplicity, and accordingly that module 42 is among the novel features of the invention.

Figure 5:
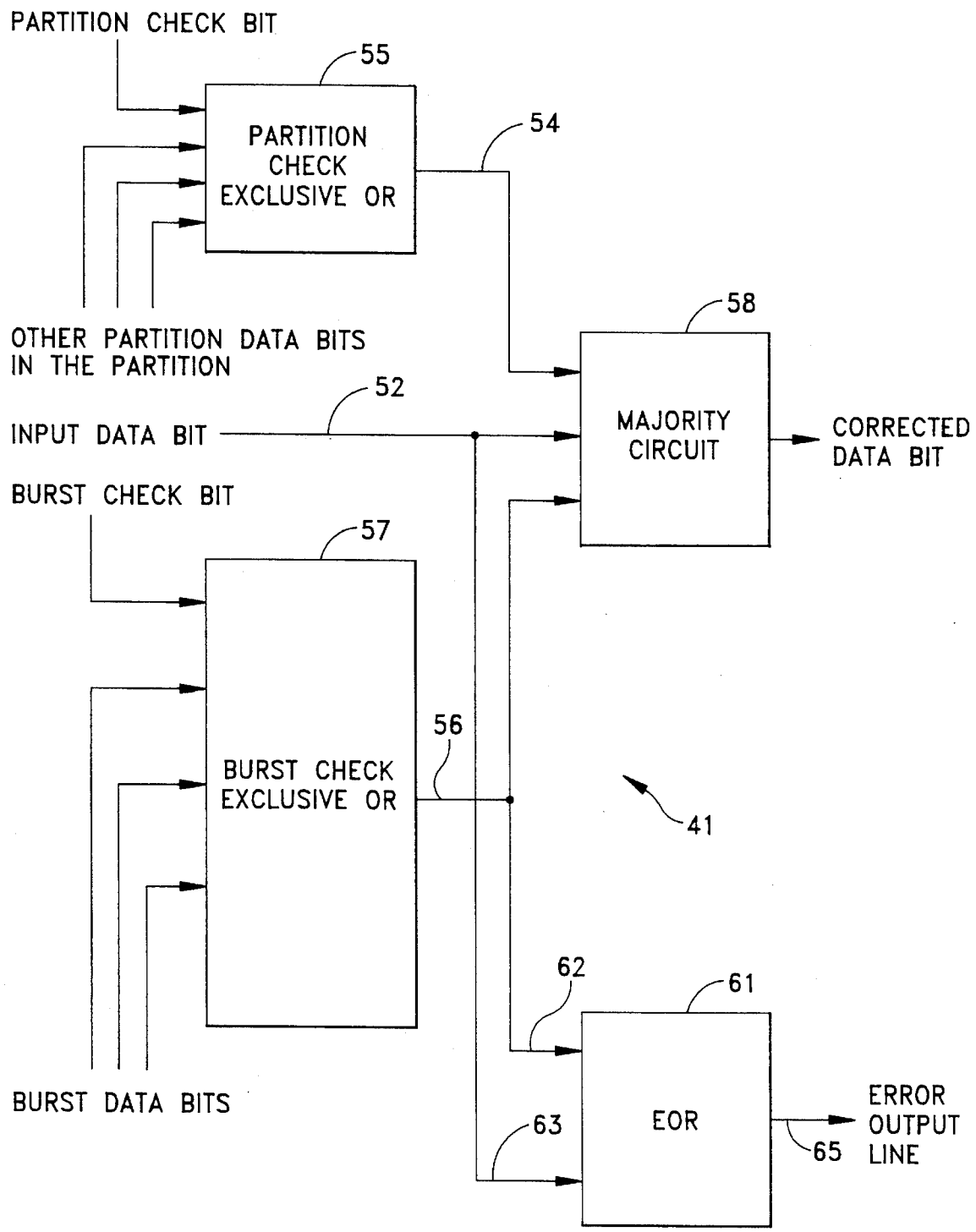
FIG. 5 is a block diagram at such still lower level of one of the error corrector and detector modules of FIG. 2.

FIG. 5 shows an embodiment of error corrector/detector (C/D) module 41. It performs the dual function of single bit error correction/burst error detection (SEC-BED). In a preferred embodiment many of the components which are employed to implement error correction module 42 (as just described) are shared in the implementation of C/D module 41. In the cases of such shared components, the same reference numeral as applied in FIG. 4 is applied in FIG. 5. Majority circuit 58 produces like corrected values in the same way they are produced in error correction module 42. That is to say, the corrected values are based upon the same three sources. However, there is provision of an additional exclusive-OR channel in which the output from exclusive-OR (EOR) circuit 57 is fed along a branch line 62 to be exclusively ORed with the input data bit (fed along a branch line 63) by an additional EOR circuit 61. The output, arrow 65, of EOR circuit 61 constitutes the error detection, or error output line.

Figure 6:
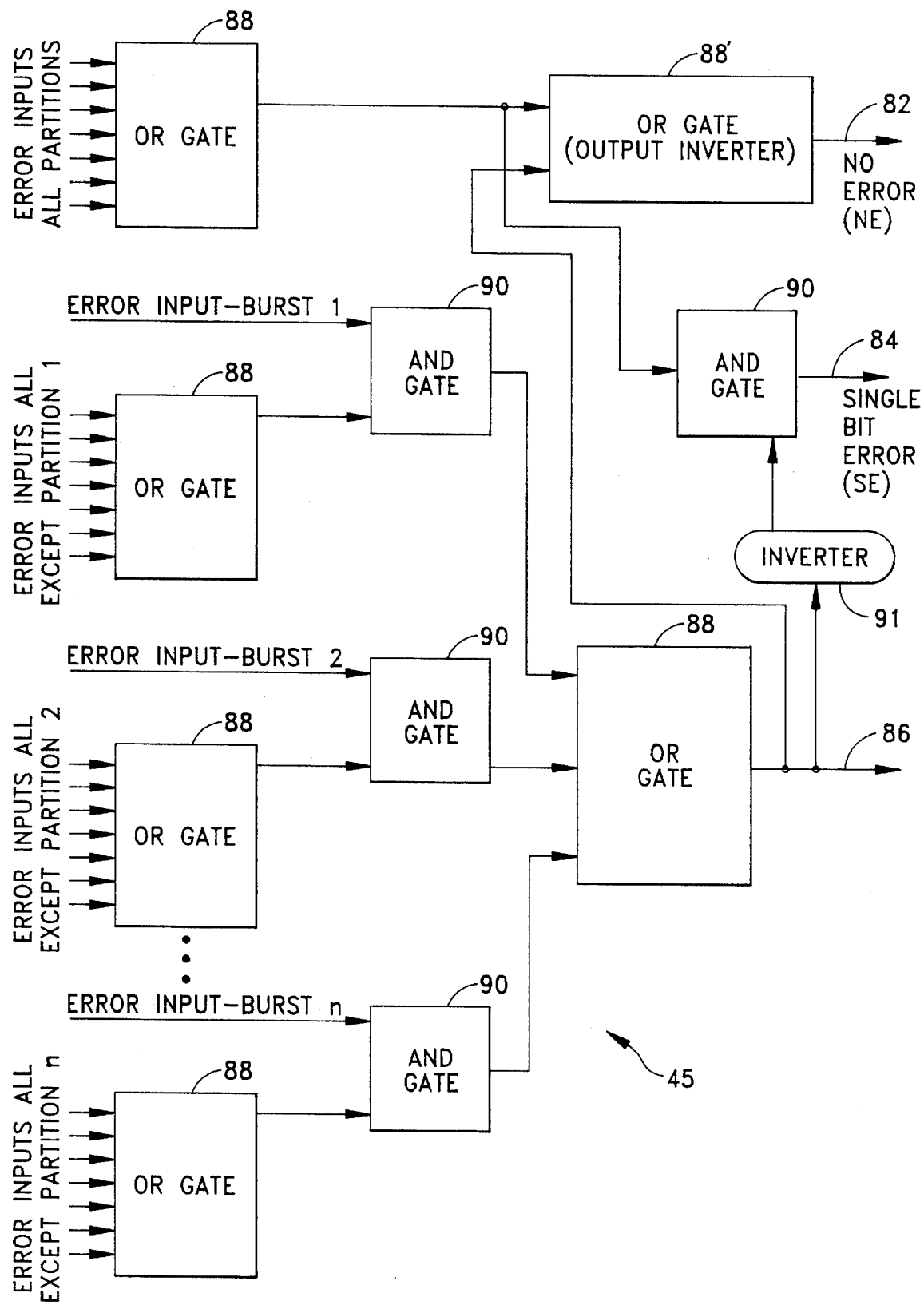
FIG. 6 is a block diagram at such still lower level of the error status module of FIG. 2.

Reference is now made to FIG. 6, which is a description of one embodiment of the error status module 45 (FIG. 2) of the error corrector and detector (ECD) 26 (FIG. 2). The logic of the error status module uses the outputs of the error detectors in the error corrector/detector modules to generate the no-error (NE) status line signal 82, the single bit error (SE) status line signal 84, and the multi-bit error (ME) status line signal 86 for central processing unit (CPU) 30 (FIG. 1). The error status module uses suitable off-the-shelf logic components including OR gates 88 (including one with inverted output 88'), AND gates 90, and inverter 91 in ways that can be readily interpreted by persons skilled in the art.

It will be appreciated that error correcting by the parallel operation of the majority voter functions of the present invention is an extremely fast approach, which is among the notable advantages of the invention over the prior art approaches to error correction and detection which employ the check bit process described in the earlier section of this specification entitled "Description of the Prior Art".

There are a number of still further advantages of the present invention. An error correction and detection system is provided which takes advantage of two independent check bit sources to provide robust error correction and detection. The system uses a unique data partitioning scheme which allows the detection of burst errors. The error correction and detection features of the system run in parallel providing the speed necessary for use in applications in which memory 20 is of a high speed type. The technique which the present invention employs for correcting an error and detecting errors separates into two different techniques enabling (i) correction of single error and (ii) burst error detection by one-step majority coding over significant ranges of data word size, p. All of the above advantages may be achieved with various memory word sizes by simply altering the number of error correction and detection modules.

Figure 7:
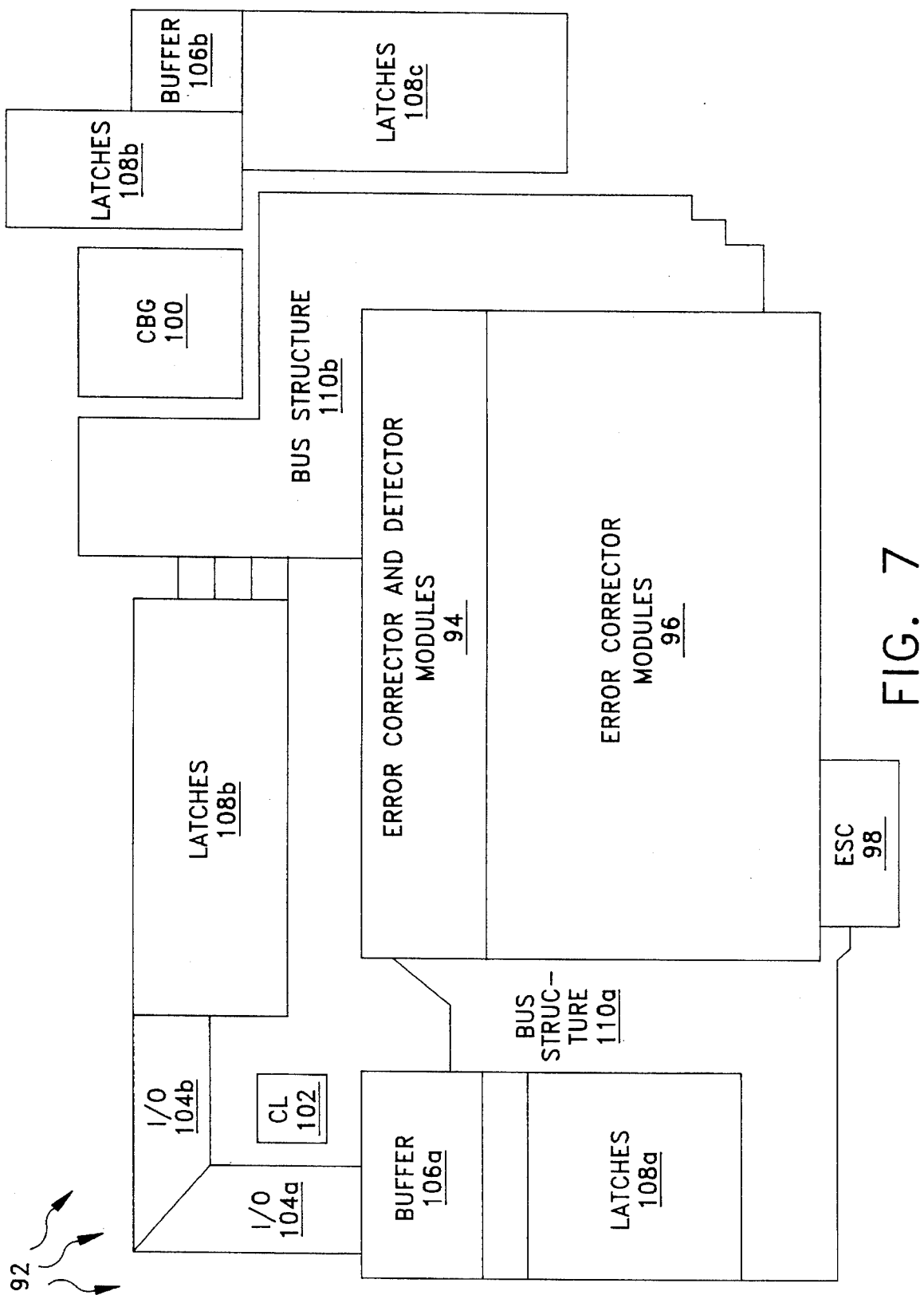
FIG. 7 is a diagrammatic depiction of a possible partitioning of the system of FIG. 1 into separate modules in connection with a very large scale integrated circuit (VLSI) chip implementation of the system.

Application specific integrated circuit (ASIC) design and production processes (which have been discussed to some extent earlier herein in connection with check bit generator 14), can be employed to embody an entire system 10 in the form of massively integrated ASIC circuit devices, or even in the form of a single such circuit device. FIG. 7 illustrates one possible arrangement of partitioning of system 10 on a single integrated circuit (VLSI) chip 92. The component partitions of the chip 92 include: error corrector and detector (ECD) modules 94; error corrector (EC) modules 96; an error status circuit (ESC) 98; a check bits generator (CBG) 100; control logic (CL) 102; first and second subpartitions of input/output (I/O) logic 104a, 104b; peripheral buffers 106a, 106b; peripheral latches 108a, 108b, 108c; and bus structures 110a and 110b. Since every bit of a data word requires a correction circuit, the number of individual units of corrections logic incorporated into modules 94 and 96 is thirty-two (32) units. However, for purposes detecting burst error eight of these are designed to include error detecting capability. Therefore, of the thirty-two, (32) units, eight (8) units are incorporated into ECD modules 94 which occupy two (2) rows of chip area, and twenty-four (24) units are incorporated into EC modules 96 which occupy six rows of chip area. This is shown in FIG. 7 by the relative areas of ECD modules 94 and EC modules 96.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. Check bit generator apparatus for use in processing bit errors inadvertently introduced in coaction between a central processing unit and a memory, said central processing unit and said memory employing a predetermined size of data word of p bits, said apparatus comprising:

exclusive-OR circuit means for generating a parity error correction code in accordance with a predetermined arrangement of binary digit values in a H-parity matrix data regeneration scheme to provide a code characterized as both linear and having the property of self orthogonality, said code further being of the subclass of such self orthogonal codes comprising codes exclusive of Latin square orthogonal codes; and said predetermined arrangement of binary digit values in the H-parity matrix data regeneration scheme including partitioning the p bits of the data word such that a partition size m equals the largest integer less than the square root of p which evenly divides p, and further being such that the number of partitions into which the information unit is divided, n, is determined by the formula n=[p/m]+m, and still further being such that the total numbers of bits k=p+r, and yet even further being such that the total number of check bits r=n+m.

2. Apparatus in accordance with claim 1, wherein said exclusive OR means us operative as one-step majority voter logic functions.

3. Apparatus in accordance with claim 1 wherein said predetermined arrangement of binary digit values in the H-parity matrix data regeneration scheme is comprised of horizontally extending vertical columns of predetermined sequences of binary values and is such that partition check bits for correcting an error are generated by exclusively-ORING the binary logic values in matrix positions in each respective one of the n partitions thereof and burst check bits for detecting a burst error are generated by exclusively-ORING the binary logic values in the same individual sequential columnar positions in all the n partitions.

4. An error corrector and detector for use in processing bit errors inadvertently introduced in the coaction between a central processing unit and a memory employing a predetermined size of data word unit of p bits, comprising:

a check bit generator for providing a predetermined error correction code responsive to a predetermined arrangement of binary digit values in a H-parity matrix data regeneration scheme to produce an error correction code characterized as both linear and having the property of self orthogonality, said correction code further being of the subclass of such self orthogonal codes comprising codes exclusive of Latin square orthogonal codes, said predetermined arrangement of binary digit values in a H-parity matrix including partitioning the p horizontally extending bit positions such that the partition size m equals the largest integer less than the square root of p and which evenly divides p and further being such that the total number of horizontally extending H-matrix positions bits k=p+r, and still further being such that the total number of check bits r=n+m;

a one-step majority decodable error decoder logic circuit module cooperative with a data stream propagating between the CPU and the memory and the error correction code produced by the check-bit generator for correcting a single bit error in the date stream;

another one-step majority decodable error decoder logic circuit module cooperative with the aforesaid data stream for detecting a burst error therein; and an error status logic circuit module receiving the outputs of the module for correcting a single bit error and of the module for detecting a burst error and generating logic status signals for no error (NE), single bit error (SE), and multiple bit error (ME) lines.

5. The error corrector and detector of claim 4, wherein:

said predetermined arrangement of binary digit values in the H-parity matrix data regeneration scheme is so chosen that partition check bits for correcting error are generated by exclusively-ORING the binary logic values in matrix positions in corresponding partitions in each respective one of the n partitions and burst check bits for detecting burst error are generated by exclusively-ORING the binary logic values in the same individual sequential positions within all the n partitions;

said one-step majority decodable error decoder logic circuit module for correcting a bit error in the data stream being operative to produce the module output in accordance with a majority vote of the binary logical values of first, second and third bit signals, said first bit signal being the exclusive-OR of the error correction check bit of the corresponding partition and the other bits in the corresponding partition, said second bit signal being the exclusive-OR of the burst error detection check bit and the other bits used to generate the burst error detection check bit, and said third bit signal being the received data bit; and said one-step majority decodable error logic circuit module for detecting burst error in the data stream being operative to exclusively-OR the burst error detection check bit and the received data bit to produce the module output.

6. The error corrector and detector of claim 4 wherein both the one-step majority decodable error decoder-logic circuit module for correcting a single bit error in the data stream and the one-step majority decodable error logic circuit module for detecting a burst error in the data stream perform their respective operations substantially in parallel with one another.

7. The error corrector and detector of claim 4 wherein p=32, n=8, m=4, r=12 and k=44.

* * * * *